(12) United States Patent
Kimura et al.

(10) Patent No.: US 7,079,907 B2
(45) Date of Patent: Jul. 18, 2006

(54) APPARATUS, SYSTEM AND METHOD FOR DESIGN SUPPORT FOR PROVIDING INFORMATION FOR BI-DIRECTIONAL REFERENCES BETWEEN DESIGN INFORMATION AND GEOMETRY INFORMATION

(75) Inventors: Fumihiko Kimura, Tokyo (JP); Shigeru Kobayashi, Aichi-ken (JP); Masakazu Ninomiya, Hiroshima (JP); Yohichiroh Ohbayashi, Isehara (JP); Akira Okano, Sagamihara (JP)

(73) Assignee: International Business Machines Corporation, Armonk, NY (US)

(*) Notice: Subject to any disclaimer, the term of this patent is extended or adjusted under 35 U.S.C. 154(b) by 476 days.

(21) Appl. No.: 10/077,157

(22) Filed: Feb. 15, 2002

(65) Prior Publication Data
US 2003/0156139 A1 Aug. 21, 2003

(51) Int. Cl.
*G06F 19/00* (2006.01)
(52) U.S. Cl. .................. 700/98; 715/804; 719/329; 707/200
(58) Field of Classification Search .............. 700/98, 700/97, 182; 345/419; 715/804; 719/329; 707/200
See application file for complete search history.

(56) References Cited

U.S. PATENT DOCUMENTS

| 5,822,206 A | * | 10/1998 | Sebastian et al. ............. 700/97 |
| 6,285,369 B1 | * | 9/2001 | Kross et al. ................ 345/419 |
| 6,611,725 B1 | * | 8/2003 | Harrison et al. ............. 700/98 |

* cited by examiner

*Primary Examiner*—Leo Picard
*Assistant Examiner*—Sheela S. Rao
(74) *Attorney, Agent, or Firm*—Douglas A. Lashmit; Hoffman, Warnick & D'Alessandro LLC

(57) ABSTRACT

A design support system comprising a digital document related module for storing a digital document used for a design operation, a geometry data related module for storing geometry data designed during the design operation, and a reference relationship related module for generating reference relationship information (a digital document that includes a reference relationship to geometry data, or geometry data that include a reference relationship to a digital document) that is established between a specific digital document and specific geometry data. To display the reference relationship from the digital document to the geometry data, the digital document related module calls up and displays the digital document, while adding and displaying information to the digital document concerning a link to the reference target geometry data.

7 Claims, 11 Drawing Sheets

FIG. 8A

(a) REFERENCE RELATIONSHIP INFORMATION IN GEOMETRY DATA THAT REFERS TO A DIGITAL DOCUMENT

| REFERENCE SOURCE GEOMETRY DATA | REFERENCE SOURCE GEOMETRICAL ELEMENT | REFERENCE SOURCE VIEWPOINT INFORMATION | REFERENCE TARGET DIGITAL DOCUMENT | REFERENCE TARGET POSITION | CREATION DATE | CREATOR | REFERENCE FREQUENCY |
|---|---|---|---|---|---|---|---|
| P1 | {f1} | ((100,100,100), (0,0,0),100) | D1 | n1 | 99/08/20 | A.O. | 1 |
| P1 | {f1} | ((100,100,100), (0,0,0),100) | D1 | n2 | 99/08/21 | Y.O. | 1 |

FIG. 8B

(b) REFERENCE RELATIONSHIP INFORMATION IN A DIGITAL DOCUMENT THAT REFERS TO GEOMETRY DATA

| REFERENCE SOURCE DIGITAL DOCUMENT | REFERENCE SOURCE POSITION | REFERENCE TARGET GEOMETRY DATA | REFERENCE TARGET GEOMETRICAL ELEMENT | REFERENCE TARGET VIEWPOINT INFORMATION | CREATION DATE | CREATOR | REFERENCE FREQUENCY |
|---|---|---|---|---|---|---|---|
| D1 | n2 | P1 | {f4} | ((100,100,100), (0,0,0),100) | 99/08/20 | A.O. | 1 |

FIG. 10

APPARATUS, SYSTEM AND METHOD FOR DESIGN SUPPORT FOR PROVIDING INFORMATION FOR BI-DIRECTIONAL REFERENCES BETWEEN DESIGN INFORMATION AND GEOMETRY INFORMATION

BACKGROUND OF THE INVENTION

1. Field of the Invention

The present invention relates to a design support system employed for a design operation using a computer, and relates in particular to a design support system for providing information for bi-directional references between design information and geometry data.

2. Related Art

Design support systems that use computers, such as CAD (Computer Aided Design) systems, are widely employed by design staff. Of the CAD systems, there are two-dimensional systems to be used to prepare drawings and three-dimensional systems to be used to design parts and products by preparing three-dimensional shapes in computer created virtual space. The three-dimensional CAD systems used for design produce shapes substantially similar to final products and are especially employed by design operating staff because it is easy to identify the shapes that are to be produced.

In addition, there are CAE (Computer Aided Engineering) systems that are used to support various types of product design related analyses. The CAE systems use analysis methods, such as the finite element method, to analyze strength and vibration. As the use of three-dimensional CAD systems has spread, an environment, where CAE system usage can be implemented by directly employing design models prepared by three-dimensional CAD systems, has been recently produced.

There are also PDM (Product Data Management) systems, to which some attention has been paid, that are concerned with such subjects as the fabrication and management of parts, the filing of documents relating to parts, and the centralization of information. These PDM systems are used to manage a variety of data concerning product development and they enable the centralization of information management, such as the file management of CAD data and document data, and the management of parts information and the processes employed in the product development.

Generally, for a design operation, not only data which is prepared during the design operation, such as shape data, the configuration of parts and other documents, but also background information (design information), which is used as the basis for determining these data, are required. The background information includes not only general data, such as laws and regulations, design references, manuals, defect information and CAE data, but also other information related to the entire design, such as the intent of the designers, the history of the design operation, the link structure background information and the link reference frequency. When the background information is used correctly, the concurrent engineering, the design changes or the preparation of similar designs can be efficiently performed without any defects being encountered.

FIG. 11 is a diagram for explaining the relationship between background information and geometry data. In order to determine the shape of a specific part 201, background information 301 for the part 201 must be examined. In another case, the geometry data for the part 201 may be obtained as specific example background information 301. That is, during the design operation, correlations are tracked bi-directionally between the background information 301 and the geometry data for the part 201. In addition, geometry data prepared for the complete part 201 are not always necessary, and there may be a case wherein, since a target portion may not be identified when the part 201 is displayed in its entirety, portions 202 constituting partial shape elements of the part 201 are designated. Similarly, in another case, instead of all of the background information 301 having to be referred to, only one document element, such as a single document, a single table or a single graphic related to a design reference 302 and an analysis method 303, is to be referred to.

A conventional CAD system can define an attribute, such as a remark, for each shape element, but is not capable of considering how to handle external design information. A PDM system can employ, as subjects, parts structure management and document management relating to parts and the one-dimensional arrangement of information, but is incapable of meeting requirements exceeding those needed for the information management process and does not obtain reference relationships. Although a PDM system can hierarchically manage design information, when reference relationships between classes are required and a search using a file name or a full search must be performed, necessary information tends to be missed.

An example technique for handling the display of a bi-directional reference relationship between digital documents is disclosed in Japanese Unexamined Patent Publication No. Hei 8-129544. In this publication, only the bi-directional relationship of documents is employed as a problem, and a relationship involving a shape model is not handled. Further, although means for accessing upper or lower part geometry data or graphic data, using tables that show the hierarchical structure of parts, are provided in Japanese Unexamined Patent Publication No. Hei 8-314985 and Japanese Examined Patent Publication No. Hei 5-6910, the means described therein are limited, applying only to the hierarchical structures of parts, and it is difficult to flexibly access required information.

To resolve the technical problems described above, the present invention provides information concerning bi-directional reference relationships between design information and geometry data that are required for a design activity. The present invention may also be used to display reference relationships, especially between two types of information, design information and geometry data, by using reference relationship information that can be used to appropriately express these data.

SUMMARY OF THE INVENTION

According to one aspect of the present invention, an information processing apparatus and a software program are provided that can increase design efficiency by sustaining the initial design intent while correlating it with the geometry data. Specifically, according to the invention, an information processing apparatus comprises: generation means for generating reference relationship information representing a correlation between design information for at least one of a document, a graphical representation and a table that are used for a design operation, and geometry data provided for a part, or for a portion that is a constituent element of the part; storage means for storing the reference relationship information; and display means for employing the reference relationship information stored in the storage means to display the fact that a reference relationship is established between the design information and the geometry data.

The display means displays information representing the fact that the reference information is established between the design information and the geometry data, in association with an element of the design information or the geometry data. This arrangement is useful when the design information is linked to the geometry data, for example, and the design information is referred to while the shape is obtained by changing the viewpoint and the magnification used for the geometry data. To present this display, the color, for example, of a shape element is changed to represent the linking, or for design information, a hyperlink or color is changed to add a remark.

When the reference relationship between the geometry data and a digital document, such as design information (background information), is to be displayed using the geometry data, an information processing apparatus according to the invention comprises: geometry data display means for displaying geometry data that is designed; generation means for generating reference relationship information that represents a reference relationship between the geometry data and a digital document on which the determination of the geometry data is based; and embedding and displaying means for embedding and displaying, in an element of the geometry data to be displayed, the linking information of the digital document that is to be referred to, based on the reference relationship information generated by the generation means.

The information processing apparatus further comprises: designation means for designating the element that includes the linking information that is embedded and displayed by the embedding and displaying means; and reference target display means for displaying the digital document, based on the linking information included in the designated element and the reference relationship information. With this arrangement, to change the design, for example, the intent of the designer of the designated shape element can be obtained from the digital document.

When geometry data that constitutes a predetermined part or portion thereof are displayed during the display of the design information for a digital document, for example, the information processing apparatus further comprises: design information display means for displaying design information used to design geometry data; generation means for generating reference relationship information for the design information to be displayed and the geometry data designed in accordance with the design information; and embedding and displaying means for embedding and displaying, in the design information to be displayed by the design information display means, linking information that is based on the reference relationship information.

Similarly, the information processing apparatus further comprises: designation means for designating the design information that includes the linking information that is embedded and displayed by the embedding and displaying means; and geometry data display means, for employing the linking information included in the designated design information, and the reference relationship information, to display the geometry data designed based on the designated design information. This configuration is excellent because, for example, when a digital document, such as a design reference, is employed, a similar design will perform efficiently.

According to another aspect of the invention, a design support system comprises: a digital document related module for storing a digital document that includes design information or background information used for a design operation; a geometry data related module for storing geometry data designed using the design operation; and a reference relationship related module for generating reference relationship information representing a correlation between a predetermined digital document and predetermined geometry data.

The reference relationship related module establishes a reference from digital document to geometry data and/or a reference from geometry data to digital document. To display the reference relationship of the digital document to the geometry data, the digital document related module calls and displays the stored digital document, and adds and displays, to the digital document, reference relationship information that is generated by the reference relationship related module as a link to reference target geometry data. To generate the reference relationship of the geometry data to the digital document, the geometry data related module calls and displays the stored geometry data, and adds and displays, to the element of the geometry data, reference relationship information that is generated by the reference relationship related module, as a link to a digital document.

According to an additional aspect of the invention, a computer program product comprising a computer usable medium having computer program logic recorded thereon for enabling a computer to support a user's design operation, the computer program logic comprising: generation means for enabling the computer to generate reference relationship information that represents a correlation between design information used for the design operation and geometry data that is obtained by the design operation; and displaying means for enabling the computer to display the design information and/or the geometry data while adding, to an element of the design information and/or of the geometry data, information indicating the fact that a reference relationship is established between the design information and the geometry data.

According to a further aspect of the invention, a computer program product according to the invention comprising a computer usable medium having computer program logic recorded thereon for enabling a computer to support a user's design operation, the computer program logic comprising: geometry data displaying means for enabling the computer to display geometry data that is designed; generation means for enabling the computer to generate reference relationship information that represents a reference relationship between the geometry data and a digital document on which the determination of the geometry data is based; and embedding and displaying means for enabling the computer to embed and display, in an element of the geometry data, the linking information of a digital document that is a reference target, based on the reference relationship information.

This computer program logic further comprises: designation recognition means for enabling the computer to recognize that a user has designated the element including the linking information that is embedded and displayed by the embedding and displaying means; and reference target display means for enabling the computer to display, after the designation is recognized, the digital document, based on the linking information included in the recognized element and the reference relationship information. This is preferable because a computer user can identify the intent behind the design of the geometry data that is based on the background information.

When multiple digital documents are present as the reference target, the reference target display means enables the computer to display a list of the multiple digital documents. When it is recognized that a specific digital document on the list has been designated, the reference target display means enables the computer to display detailed information for the specific digital document. With this arrangement, a computer user can obtain almost all the information for a related digital document that is to be referred to, and can browse it in detail, as needed.

According to a still further aspect of the invention, a computer program product comprising a computer usable medium having computer program logic recorded thereon for enabling a computer to support a user's design operation, the computer program logic comprising: digital document display means for enabling the computer to display digital document information; generation means for enabling the computer to generate information for a reference relationship between the digital document information to be displayed by the digital document display means, and geometry data designed; and embedding and displaying means for enabling the computer to embed and display, in the digital document information to be displayed by the digital document display means, linking information that is based on the reference relationship information generated by the generation means. The computer program logic further comprises: designation recognition means for enabling the computer to recognize that a user has designated the digital document information including the linking information that is embedded and displayed by the embedding and displaying means; and geometry data display means for enabling the computer to employ, after the designation has been recognized, the reference relationship information to display geometry data that is designed based on the designated digital document information.

This program can be transmitted by a program transmission apparatus via the Internet to the computer of a user who is a client, and can be used for the functions performed by this computer. Furthermore, an operator may install the program in each computer to implement the function of the present invention.

According to one more aspect of the invention, a design support information display method comprises the steps of: storing information for a reference relationship between digital document information and geometry data; searching for reference relationship information that matches a digital document to be displayed; and displaying the digital document, while linking information to geometry data as a reference target is added to a predetermined position of the source digital document by employing the reference relationship information.

Further, according to the invention, a design support information display method comprises the steps of: storing information for a reference relationship between digital document information and geometry data; searching for reference relationship information that matches geometry data to be displayed; and displaying the geometry data, while linking information to the digital document as a reference target is added to an element of the source geometry data by employing the reference relationship information.

These design support information methods can be provided as computer-readable programs that are recorded on a storage medium. This storage medium can be, for example, a CD-ROM, and the program can be read by reading means, such as the CD-ROM drive of the computer, and executed.

BRIEF DESCRIPTION OF THE DRAWINGS

The features of the present invention will now be described in detail while referring to the accompanying drawings, wherein like designations denote like elements, and wherein:

FIGS. 5A and 5B are flowcharts showing the process performed for displaying geometry data that a digital document refers to and the process performed for displaying a digital document that geometry data refers to.

FIGS. 8A and 8B are diagrams showing example reference relationship information that is generated by a reference relationship information generator and is stored in a reference relationship information storage unit.

FIG. 10 is a diagram showing an example display for a digital document.

DETAILED DESCRIPTION OF THE PRESENT INVENTION

Figure 1:
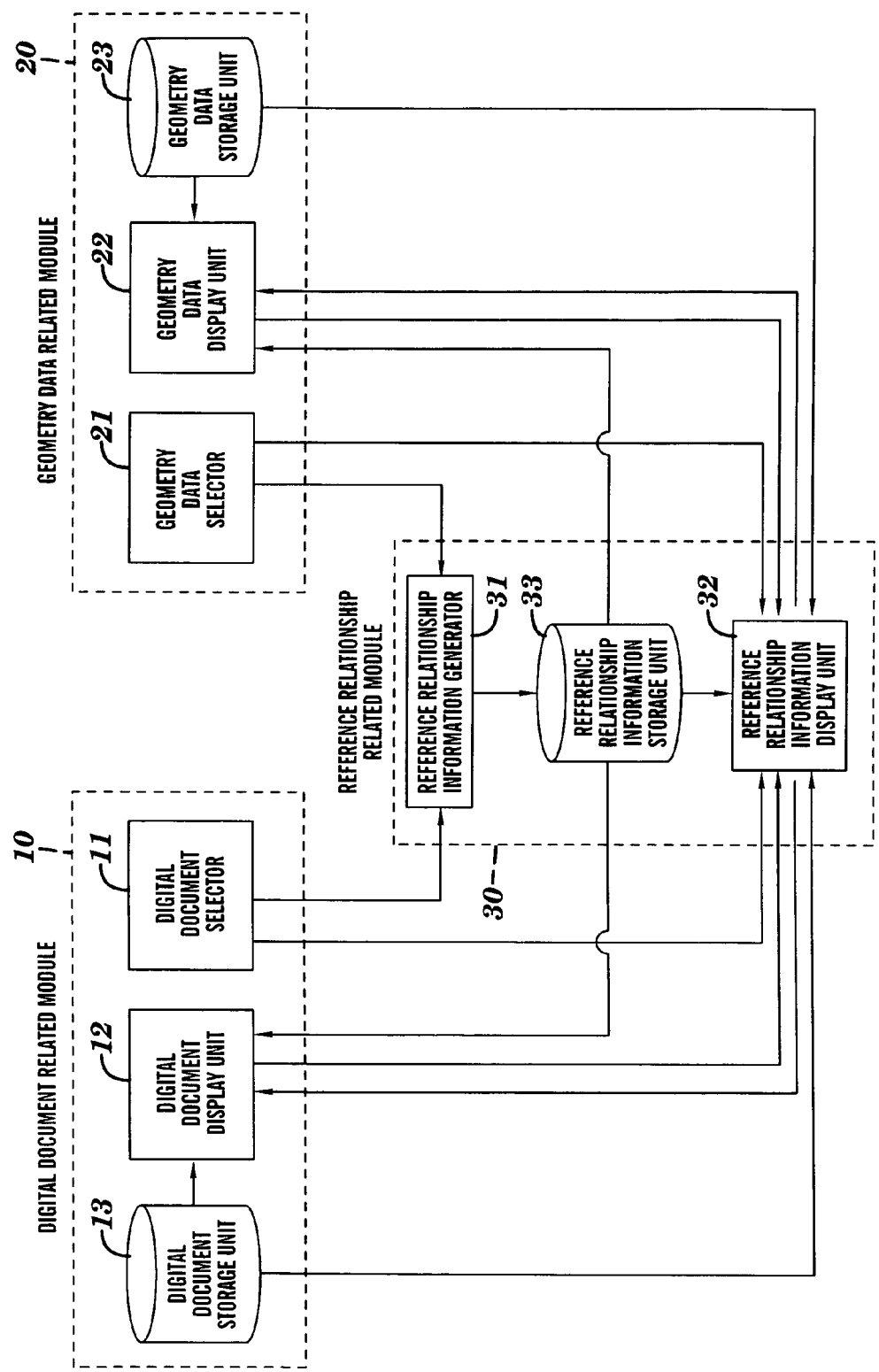
FIG. 1 is a diagram showing the general configuration of a design support system according to one embodiment of the present invention.

FIG. 1 is a diagram showing the basic structure of a design support system according to the an embodiment of the present invention. This system comprises: a digital document related module 10, for handling design information that is indispensable for a design activity; a geometry data related module 20, for handling geometry data for a part or a portion of a predetermined size; and a reference relationship related module 30, for handling information for a reference relationship between a digital document and geometry data.

The digital document related module 10 includes a digital document selector 11, for selecting information for a digital document; a digital document display unit 12, for displaying, based on reference relationship information, a digital document relating to, for example, selected geometry data; and a digital document storage unit 13, for storing, as digital documents, documents or design information (background information), such as a graphics or a table, relating to a design reference or an analysis method.

The geometry data related module 20 includes a geometry data selector 21, for selecting geometry data; a geometry data display unit 22, for embedding in the geometry data the link from the geometry data to the digital document and for displaying the resultant data; and a geometry data storage unit 23, for storing geometry data with the relationships of multiple portions relating to a predetermined part.

The reference relationship related module 30 includes a reference relationship information generator 31, for generating a reference relationship from a digital document to geometry data, or a reference relationship from geometry data to a digital document; a reference relationship information storage unit 33, for storing the reference relationship information generated by the reference relationship information generator 31; and a reference relationship information display unit 32, for employing the reference relationship stored in the reference relationship information storage unit 33 to display geometry data or a digital document that is a reference target.

Figure 2:
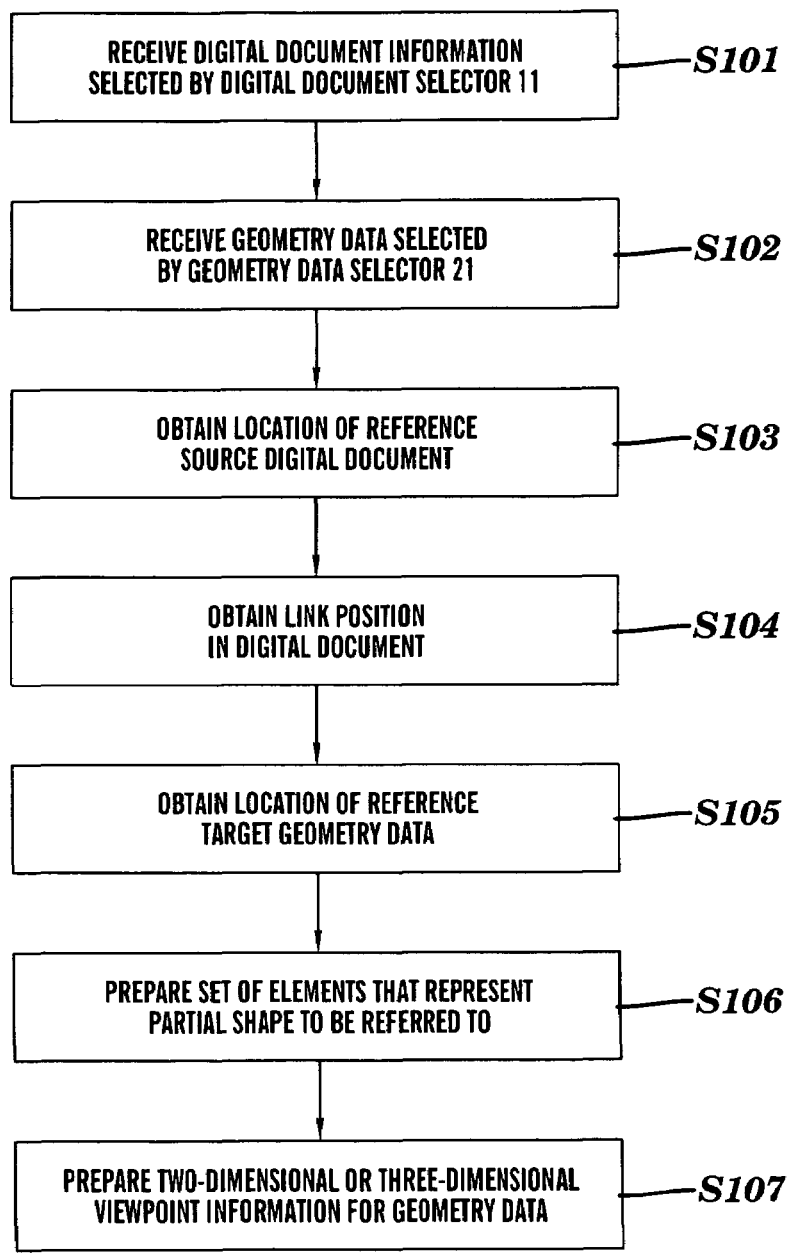
FIG. 2 is a flowchart showing the processing performed for generating a reference relationship from a digital document to geometry data.

FIG. 2 is a flowchart showing the process for generating reference relationship information from a digital document to geometry data. First, the reference relationship information generator 31 receives information for a digital document selected by the digital document selector 11 (step 101), as well as information for geometry data selected by the geometry data selector 21 (step 102). Then, the reference relationship information generator 31 obtains, as reference relationship information, the location of a digital document that is a reference source (step 103), obtains the position in the digital document to which the geometry data is to be linked (step 104), and acquires, as reference relationship information, the location of geometry data that is a reference target (step 105). Thereafter, the reference relationship information generator 31 generates a set of geometry elements that represent the shape of a part to be referred to (step 106), and generates, as reference relationship information, two-dimensional or three-dimensional viewpoint information for the geometry data (step 107). The information that is generated by the reference relationship information generator 31 for the reference relationship from the digital document to the geometry data is stored in the reference relationship information storage unit 33 with the attributes, such as the creation date, the creator, the reference frequencies and the link type.

Figure 3:
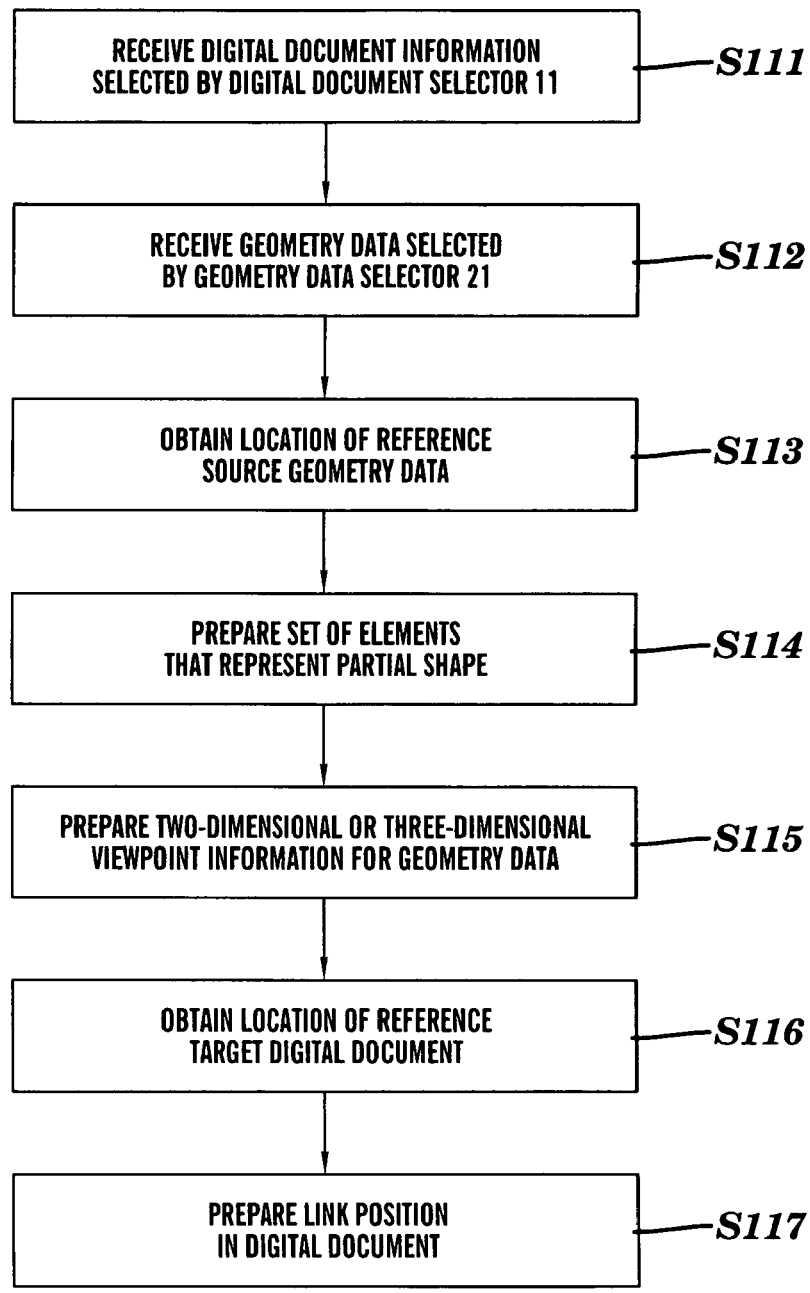
FIG. 3 is a flowchart showing the processing performed for generating a reference relationship from geometry data to a digital document.

FIG. 3 is a flowchart for the processing performed when generating reference relationship information from geometry data to a digital document. First, the reference relationship information generator 31 receives information for a digital document selected by the digital document selector 11 (step 111), as well as information for geometry data selected by the geometry data selector 21 (step 112). Then, the reference relationship information generator 31 obtains, as reference relationship information, the location of geometry data that is a reference source (step 113), generates a set of elements that represent the shape of a part (step 114), and generates two-dimensional or three-dimensional viewpoint information for the geometry data (step 115). Furthermore, the reference relationship information generator 31 obtains the location of a digital document that is a reference target (step 116) and generates the link position in the digital document (step 117). The information that is generated by the reference relationship information generator 31 for the reference relationship from the geometry data to the digital document is stored in the reference relationship information storage unit 33 with the attributes, such as the creation date, the creator, the reference frequencies and the link type.

Figure 4A:
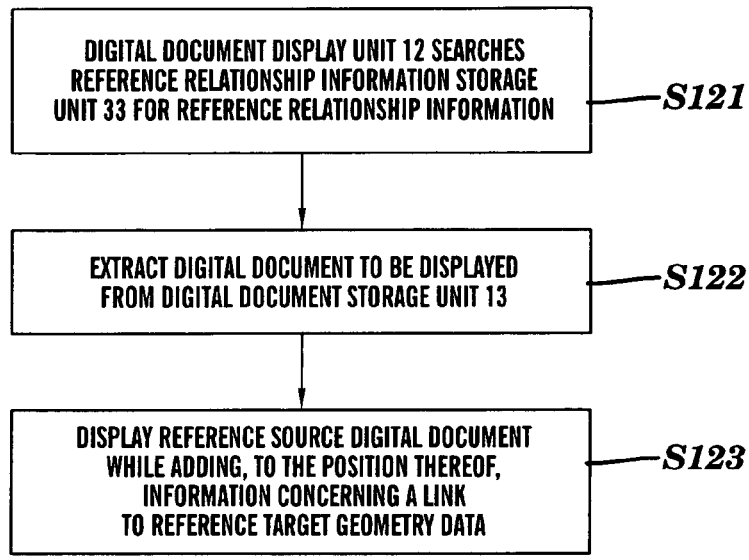
FIGS. 4A and 4B are flowcharts showing the process performed for displaying a digital document and the process performed for displaying geometry data.
Figure 4B:
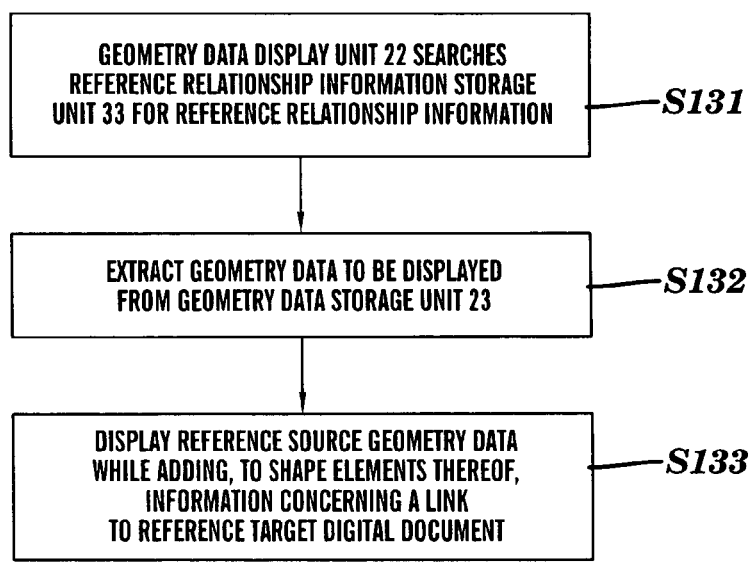

FIGS. 4A and 4B are flowcharts showing the process to be performed when displaying a digital document and the process to be performed when displaying geometry data. In the process for displaying a digital document, the link to geometry data is embedded in a digital document. Specifically, as is shown in FIG. 4A, first, the digital document display unit 12 searches the reference relationship information storage unit 33 for reference relationship information (step 121). Then, the digital document display unit 12 obtains, from the digital document storage unit 13, a digital document to be displayed (step 122). Thereafter, while using the reference relationship information in which the digital document to be displayed is included as a reference source, the digital document display unit 12 adds the information for the link to the geometry data, which constitute a reference target, to the position of the digital document, which is the reference source, and displays the resultant digital document (step 123).

In the process for displaying geometry data, the link to a digital document is embedded in the geometry data. Specifically, as is shown in FIG. 4B, first, the geometry data display unit 22 searches the reference relationship information storage unit 33 for reference relationship information (step 131). Then, the geometry data display unit 22 obtains, from the geometry data storage unit 23, geometry data to be displayed (step 132). Thereafter, while using the reference relationship information in which the geometry data to be displayed is included as a reference source, the geometry data display unit 22 adds the information for the link to the digital document, which is a reference target, to the shape element of the geometry data, which constitutes the reference source, and displays the resultant geometry data (step 133).

Figure 5A:
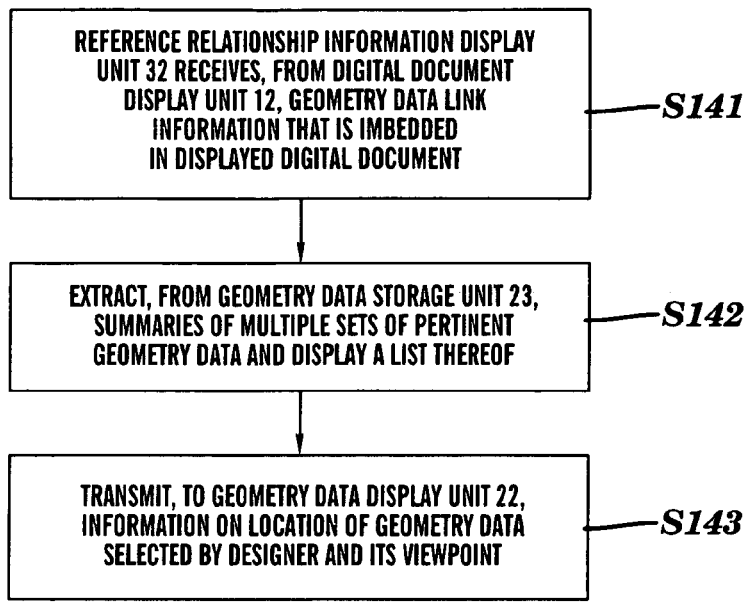
Figure 5B:
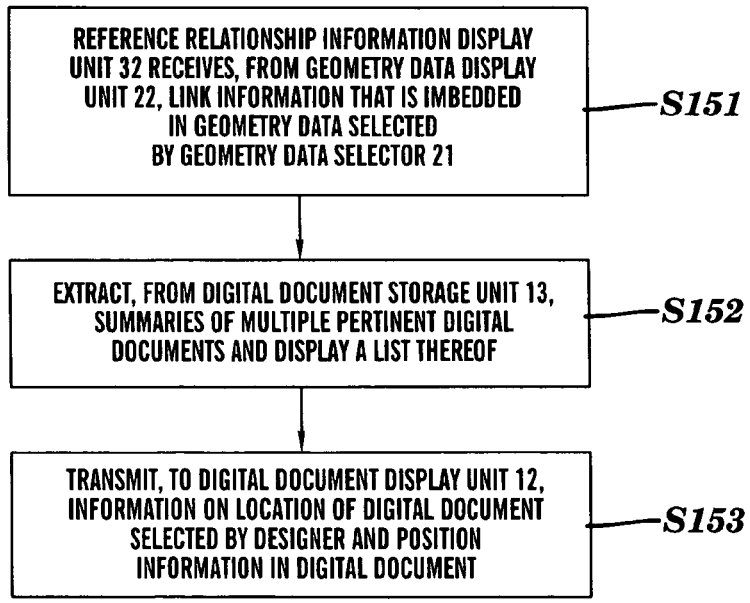

FIGS. 5A and 5B are flowcharts for the process performed for displaying geometry data that is referred to by a digital document, and the process performed for displaying a digital document that is referred to by geometry data. As is shown in FIG. 5A, in the process for displaying geometry data that is referred to by a digital document, first, the reference relationship information display unit 32 receives, from the digital document display unit 12, information for the link to the geometry data that is embedded in the digital document that is currently displayed (step 141). Then, the reference relationship information display unit 32 extracts the summary of multiple pertinent geometry data sets from the geometry data storage unit 23 and displays the list of the geometry data (step 142). Information on the location of the geometry data selected by a designer, and two-dimensional or three-dimensional viewpoint information related to the geometry data are transmitted to the geometry data display unit 22 (step 143), which displays the received geometry data.

As is shown in FIG. 5B, in the process for displaying a digital document that is referred to by geometry data, first, the reference relationship information display unit 32 receives, from the geometry data display unit 22, the link information that is embedded in the geometry data selected by the geometry data selector 21 (step 151). Then, the reference relationship information display unit 32 extracts a summary of multiple pertinent digital documents from the digital document storage unit 13 and displays the list of the digital documents (step 152). Information on the location of the digital document selected by a designer and the position information within the digital document are then transmitted to the digital document display unit 12 (step 153), which displays the received digital document.

Figure 6A:
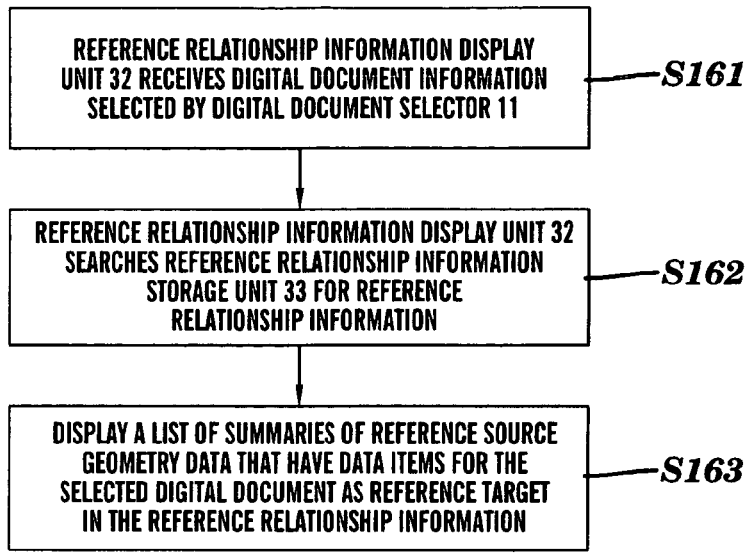
FIGS. 6A and 6B are flowcharts showing the process performed for displaying geometry data that refers to a digital document, and the process performed for displaying a digital document that refers to geometry data.
Figure 6B:
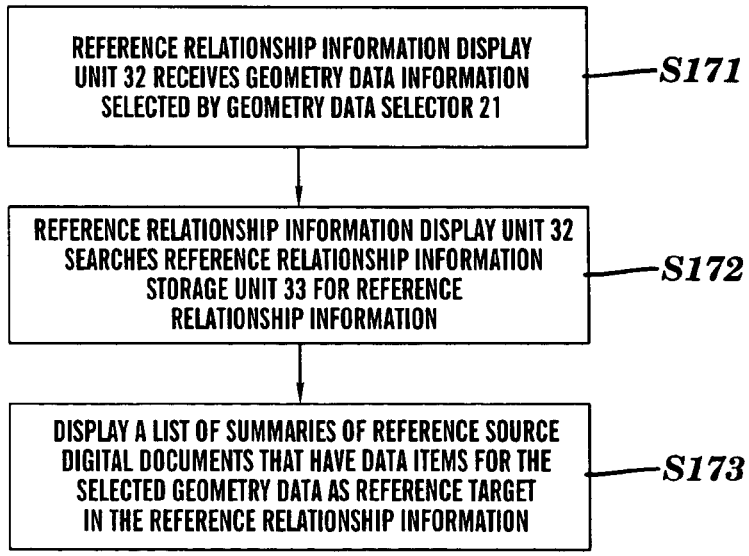

FIGS. 6A and 6B are flowcharts for the process performed for displaying geometry data that refers to a digital document, and the process performed for displaying a digital document that refers to geometry data. As is shown in FIG. 6A, in the process for displaying geometry data that refers to a digital document, first, the reference relationship information display unit 32 receives digital document information that is selected by the digital document selector 11 (step 161). Then, the reference relationship information display unit 32 searches the reference relationship information storage unit 33 for the reference relationship information (step 162). Thereafter, the reference relationship information display unit 32 displays a list of the summaries of geometry data that are reference sources in the reference relationship information, in which the selected digital document is included as a reference target (step 163). Through this process sequence, the geometry data that refer to the digital document can be displayed.

In the process for displaying a digital document that refers to geometry data, as is shown in FIG. 6B, first, the reference relationship information display unit 32 receives geometry data information selected by the geometry data selector 21 (step 171). Then, the reference relationship information display unit 32 searches the reference relationship information storage unit 33 for the reference relationship information (step 172). Thereafter, the reference relationship information display unit 32 displays the list of the summaries of digital documents that are reference sources in the reference relationship information, in which the selected geometry data is included as reference target (step 173). Through this process sequence, the digital documents that refer to the geometry data can be displayed.

In order to track the link in reverse, not only is the reference relationship information searched for in the reference relationship information storage unit 33, but also a link in the reverse direction may be formed in advance during the display provided by the reference relationship information display unit 32. For example, the forward direction or the reverse direction may be provided as an attribute of a link, and only the displayed portion and the forward or reverse direction may be designated to display the reference target or the reference source.

Figure 7:
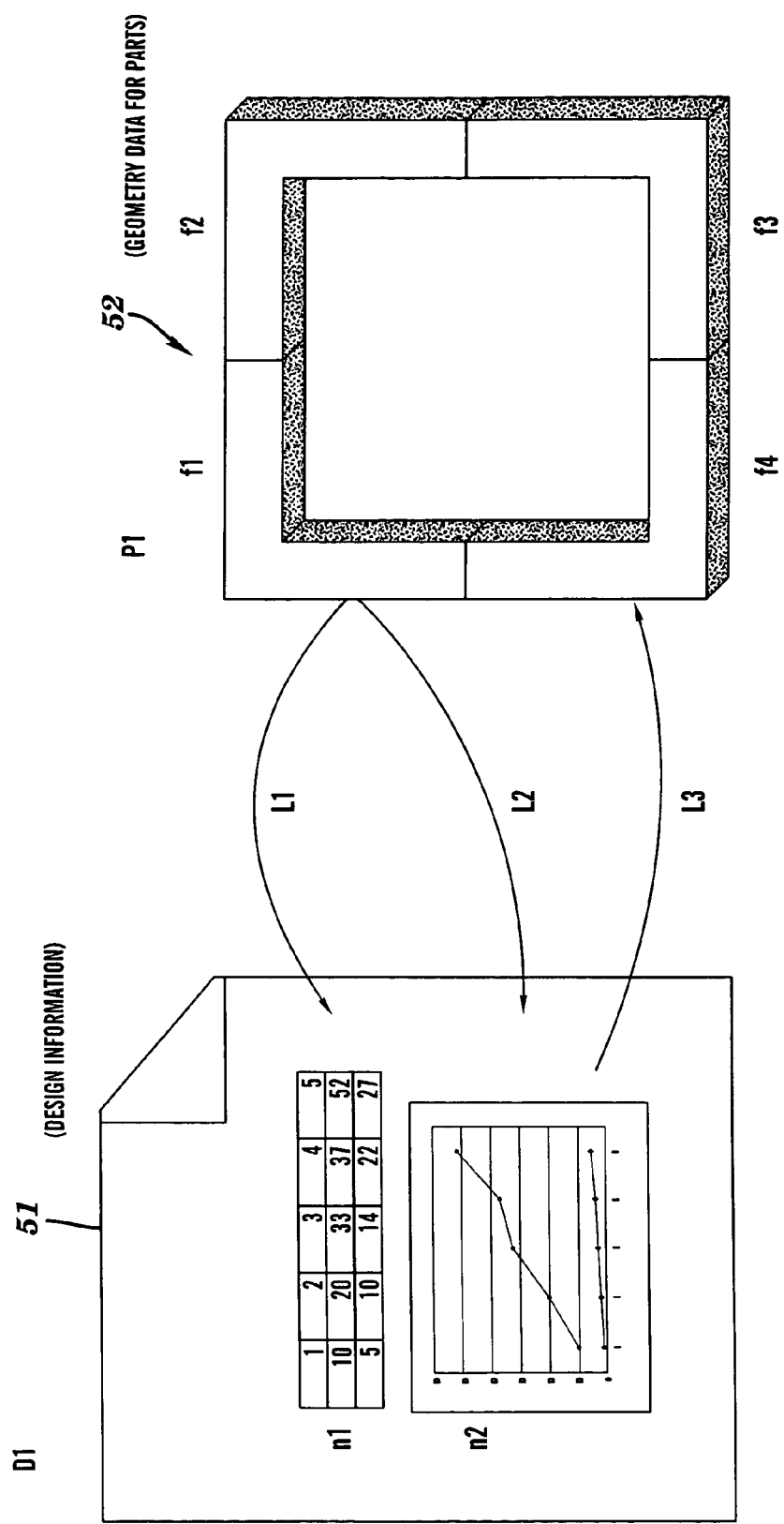
FIG. 7 is a diagram showing an example reference relationship between design information, which is a digital document, and geometry data.

FIG. 7 is a diagram showing the reference relationship between design information, which is a digital document, and geometry data. In FIG. 7, design information (D1) 51, which is a digital document, and geometry data for parts (P1) 52 are shown, and the design information (D1) 51 includes a table n1 and a graph n2, while the geometry data for parts (p1) 52 includes portions f1, f2, f3 and f4, which are shape elements. To form a link L1, for example, from the portion f1 of the geometry data for parts (P1) 52 to the table n1 in the design information (D1) 51, the reference relationship information generator 31 receives, from the digital document selector 11, the information (D1, n1) for the table n1 of the design information (D1) 51, and also receives, from the geometry data selector 21, the information (P1, f1) for the portion f1 of the geometry data for parts (P1) 52. The reference relationship information generator 31 then generates reference relationship information, which is the link L1, and stores it in the reference relationship information storage unit 33. In addition, to form a link L2, for example, from the portion f1 of the geometry data for parts (P1) 52 to the graph n2 in the design information (D1) 51, the reference relationship information generator 31 receives, from the digital document selector 11, the information (D1, n2) for the graph n2 of the design information (D1) 51, and also receives, from the geometry data selector 21, the information (P1, f1) for the portion f1 of the geometry data for parts (P1) 52. The reference relationship information generator 31 then generates reference relationship information, which is the link L2. Further, to form a link L3, for example, from the graph n2 of the design information (D1) 51 to the portion f4 of the geometry data for parts (P1) 52, the reference relationship information generator 31 receives, from the digital document selector 11, the information (D1, n2) for the graph n2 of the design information (D1) 51, and also receives, from the geometry data selector 21, the information (P1, f4) for the portion f4 of the geometry data for parts (P1) 52. The reference relationship information generator 31 then generates reference relationship information, which is the link L3.

FIGS. 8A and 8B are diagrams showing example reference relationship information that is generated by the reference relationship information generator 31 and stored in the reference relationship information storage unit 33. In FIG. 8A, the reference relationship information from the geometry data to a digital document is shown, and in FIG. 8B, the reference relationship information from a digital document to geometry data is shown. In FIG. 8A, reference source geometry data P1, which is the geometry data for parts (P1) 52, and the reference source geometrical element portion, which is the portion f1, are shown as the reference relationship information from the geometry data to the digital document.

Furthermore, ((100, 100, 100), (0, 0, 0), 100), for example, is set as the reference source viewpoint information and can be employed as an initial value (default value). In addition, a digital document D1, which is the design information (D1) 51, and reference target positions n1 and n2, which is link information n1 and n2, are stored. The date whereat a link was formed, the creator who formed the link and the reference frequency are also stored as link information. It should be noted that a directory for file management and a URL (Uniform Resource Locator) for obtaining the contents of design information via the Internet can be included as digital documents.

In FIG. 8B, the reference relationship information from the digital document to the geometry data, includes reference source digital document D1, which is the design information (D1) 51, the reference source position n2, reference target geometry data P1, which is the geometry data for parts (P1) 52, the reference target geometrical element, which is the portion f4, ((100, 100, 100), (0, 0, 0), 100), which is the reference target viewpoint information, and other information, such as the creation date, the creator and the frequency of reference. These data are generated as reference relationship information by the reference relationship information generator 31 and are stored in the reference relationship information storage unit 33.

To display the geometry data, the geometry data display unit 22 examines the reference relationship information stored in the reference relationship information storage unit 33, and embeds and displays the link from f1 to n1 or to n2 in the geometry data. Further, in order to read a digital document that the portion f1 refers to, when the portion f1 on the screen is clicked on by the designer, the reference relationship information display unit 32 rearranges n1 and n2 in the order of their creation dates, of their creators, or of their reference frequencies, and displays the list using icons that are employed for the GUI (Graphical User Interface) or thumbnails, which are image samples. For example, by clicking on the table n1 or the graph n2 the designer can read the designated digital document in detail. In this case, in order to indicate that relative to the portion f1, for example, the reference relationship information is present, the color of the portion f1 can be changed to indicate that a link is present. Or instead of changing the color, an annotation, consisting of a remark or a note, or an enhanced representation may be employed to inform the user that a link is present.

Figure 9:
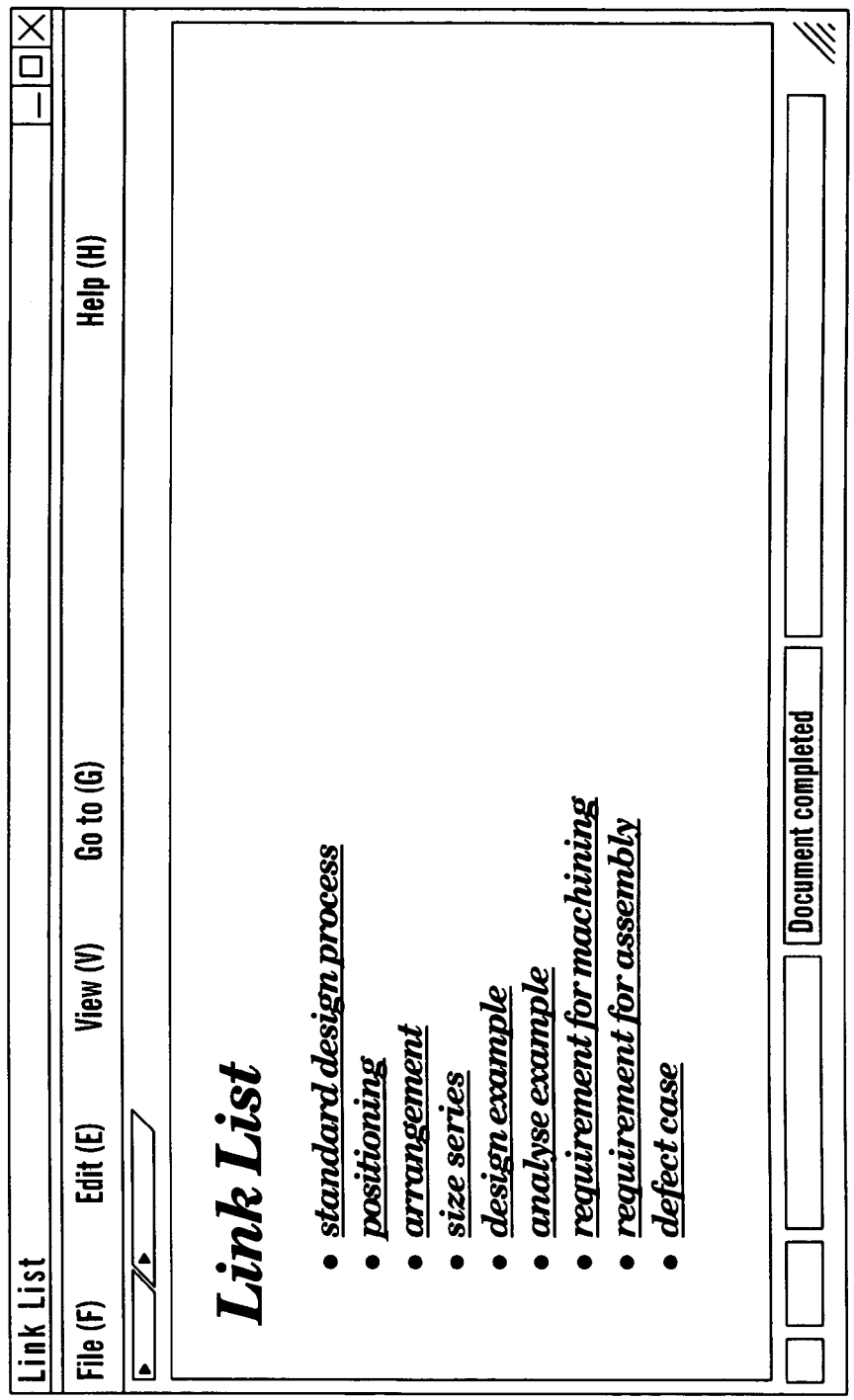
FIG. 9 is a diagram showing an example link information list.
Figure 11:
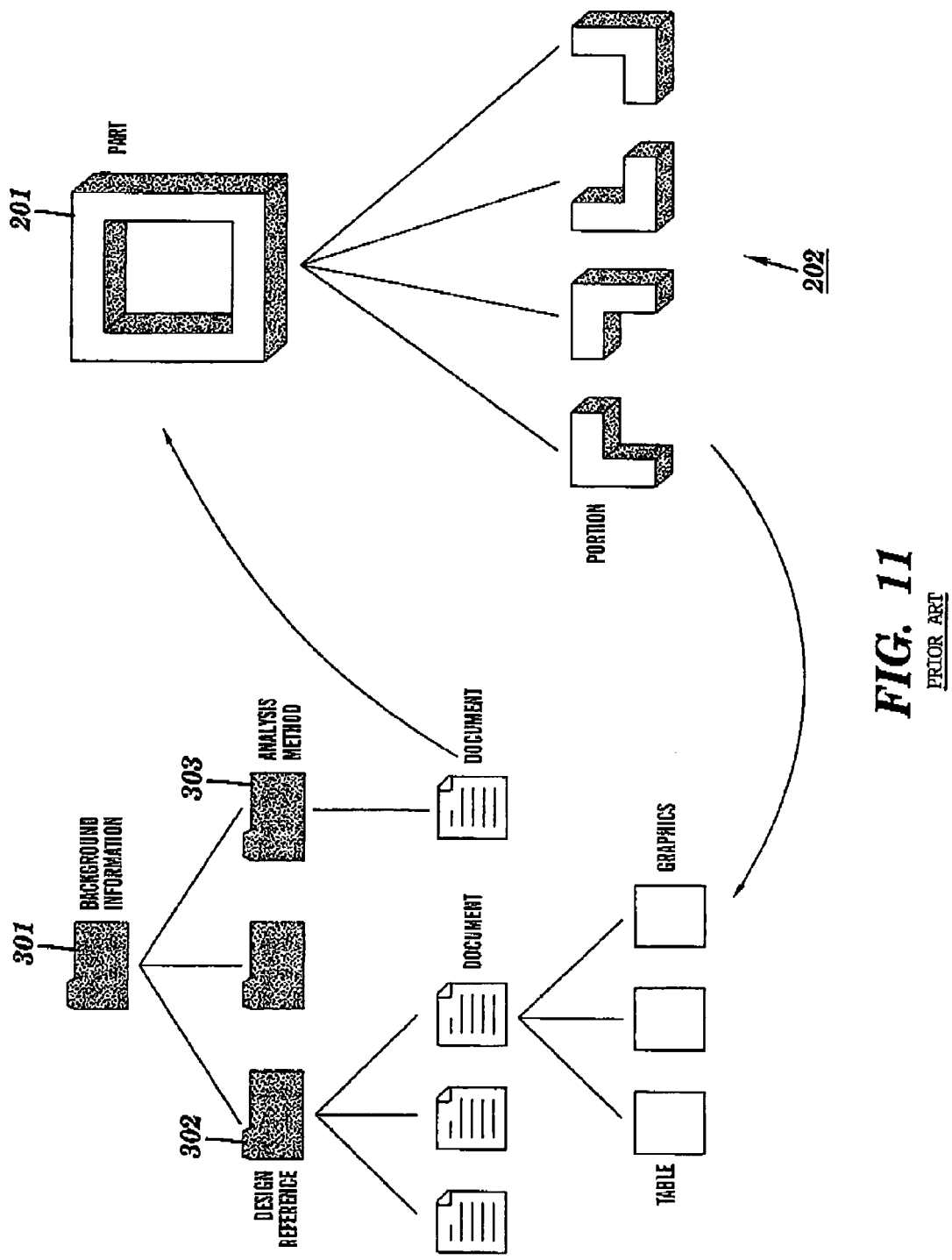
FIG. 11 is a diagram illustrating the relationship existing between background information and geometry data.

FIG. 9 is a diagram showing an example link information list. In this example, nine link information entries are shown (a link list). When a designer selects a specific entry from among these nine hyperlinked entries, detailed information for the selected digital document is displayed.

Figure 10:
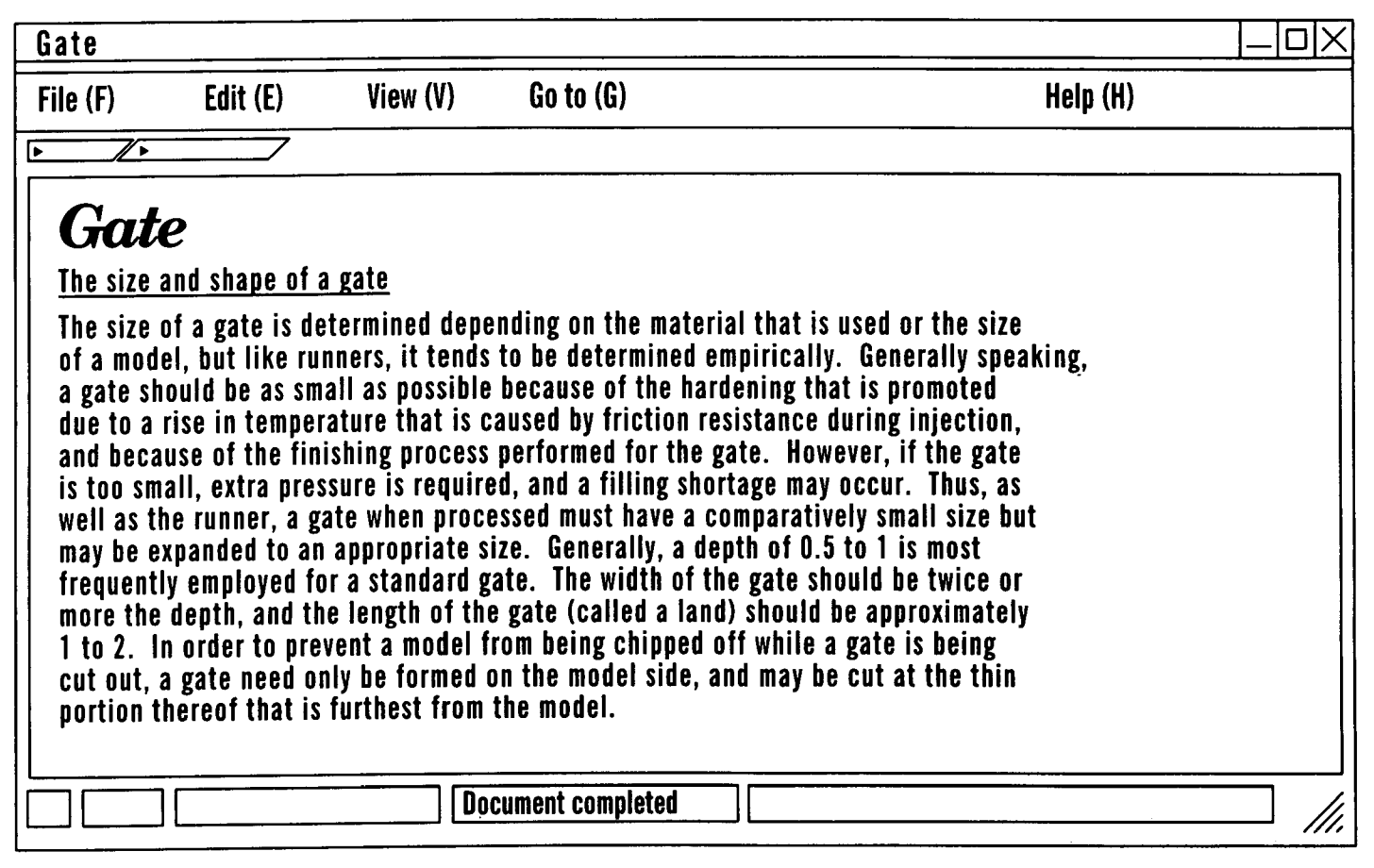

FIG. 10 is a diagram showing an example display for a digital document. In this example, a design reference for a gate is shown, and a link to geometry data is generated as the reference relationship information. When, for example, the designer clicks on "the size and shape of a gate", which is hyperlinked and underlined text, geometry data for shapes that were actually designed in accordance with the design reference can be displayed.

As is described above, according to the present invention, since digital documents, such as design information, are recorded and managed, and are also provided in an easily handled form, the design efficiency can be improved. For example, when the design intent of a designer is sustained by being correlated with the geometry data, notices for design alterations and for similar designs can be easily understood. Further, the past examples can be referred to, the rules or specifications required for automatic design can be collected, or the design operation can be changed in accordance with its recorded history.

As a special effect produced by a link (a bi-directional reference) between geometry data and design information, the shape of the design information, such as the design intent or a design defect, when such has occurred, can be instinctively and easily obtained. Conventionally, a drawing attached to a report concerning a defect is only associated with a pertinent portion, and the location of that portion relative to the part as a whole can not be easily understood. However, a design information that is linked to geometry data can be referred to, while the shape can be obtained by changing the viewpoint of the geometry data and the magnification rate.

Further, according to the present invention, design information, such as the hierarchical structure of parts and attribute data for the parts, is extended to the overall area, so that the bi-directional reference relationship between the design information and the geometry data can be implemented. Therefore, regardless of the hierarchical structure of the parts, necessary information can be flexibly accessed. In this embodiment, for example, geometry data can be accessed by referring to an associated design reference, which is one example of design information, or design information can be accessed from associated geometry data. Thus, the designer can easily move back and force between design information and geometry data, and can easily access necessary data that is required for the design.

As is described above, according to the invention, the information for a bi-directional reference relationship existing between design information and geometry data that are required for a design activity can be provided for a user.

The foregoing description of the embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

DESCRIPTION OF THE REFERENCE NUMERALS

10: Digital document related module
11: Digital document selector
12: Digital document display unit
13: Digital document storage unit
20: Geometry data related module
21: Geometry data selector
22: Geometry data display unit
23: Geometry data storage unit
30: Reference relationship related module
31: Reference relationship information generator
32: Reference relationship information display unit
33: Reference relationship information storage unit
51: Design information (D1)
52: Geometry data for parts (P1)

The invention claimed is:

1. An information processing apparatus comprising:
generation means for generating bi-directional reference relationship information representing a correlation between design information used for a design operation, and geometry data that is obtained by the design operation;
storage means for storing said reference relationship information generated by said generation means;
display means for employing said reference relationship information stored in said storage means to display linking information indicating that a reference relationship is established between said design information and said geometry data; and
means for obtaining said design information from said geometry data and for obtaining said geometry data from said design information, using said linking information.

2. The information processing apparatus according to claim 1, wherein said design information, for which said reference relationship information is generated by said generation means, is at least one of a document, a graphical representation and a table.

3. The information processing apparatus according to claim 1, wherein said geometry data, for which said reference relationship information is generated by said generation means, is data for a part, or for a portion that is a constituent element of said part.

4. The information processing apparatus according to claim 1, wherein said display means displays said linking information indicating that said reference relationship is established between said design information and said geometry data, in association with an element of said design information or said geometry data.

5. A design support system comprising:
a digital document related module for storing a digital document that includes design information or background information used for a design operation;
a geometry data related module for storing geometry data designed using said design operation; and
a reference relationship related module for generating bi-directional reference relationship information representing a correlation between a predetermined digital document stored by said digital document related module and predetermined geometry data stored by said geometry data related module, wherein said reference relationship related module establishes a reference from digital document to geometry data and/or a reference from geometry data to digital document;
wherein the said digital document related module calls and displays said stored digital document, and adds and displays, to said digital document, reference relationship information that is generated by said reference relationship related module as a link to reference target geometry data and wherein said geometry data related module calls and displays said stored geometry data, and adds and displays, to an element of said geometry data, reference relationship information that is generated by said reference relationship related module, as a link to a digital document.

6. A computer program product comprising a computer usable medium having computer program logic recorded thereon for enabling a computer to support a user's design operation, the computer program logic comprising:

generation means for enabling the computer to generate bi-directional reference relationship information that represents a correlation between design information used for the design operation and geometry data tat is obtained by said design operation;

displaying means for enabling the computer to display said design information and/or said geometry data while adding, to an element of said design information and/or of said geometry data, linking information indicating the fact that a reference relationship is established between said design information and said geometry data; and means for obtaining said design information from said geometry data and for obtaining said geometry data from said design information, using said linking information.

7. A computer program product comprising a computer usable medium having computer program logic recorded thereon for enabling a computer to support a user's design operation, the computer program logic comprising: geometry data displaying means for enabling the computer to display geometry data that is designed;

generation means for enabling the computer to generate bi-directional reference relationship information that represents a reference relationship between said geometry data and a digital document on which the determination of said geometry data is based;

embedding and displaying means for enabling the computer to embed and display, in an element of said geometry data displayed by said geometry data displaying means, the linking information of a digital document that is a reference target, based on said reference relationship information generated by said generation means; and designation recognition means for enabling the computer to recognize that a user has designated said element including the linking information that is embedded and displayed by said embedding and displaying means; and reference target display means for enabling the computer to display, after the designation is recognized by said designation recognition means, said digital document, based on said linking information included in said recognized element and said reference relationship information;

wherein, when multiple digital documents are present as the reference target, said reference target display means enables the computer to display a list of said multiple digital documents; and wherein, when it is recognized that a specific digital document on said list has been designated, said reference target display means enables the computer to display detailed information for said specific digital document.

* * * * *